(12) United States Patent
Chan et al.

(10) Patent No.: US 7,446,630 B2
(45) Date of Patent: Nov. 4, 2008

(54) PHASE SHIFTER CIRCUIT

(75) Inventors: Chia-Yu Chan, Taipei (TW); Jean-Fu Kiang, Taipei (TW)

(73) Assignee: National Taiwan University, Taipei (TW)

( * ) Notice: Subject to any disclaimer, the term of this patent is extended or adjusted under 35 U.S.C. 154(b) by 1 day.

(21) Appl. No.: 11/798,875

(22) Filed: May 17, 2007

(65) Prior Publication Data
US 2008/0180190 A1    Jul. 31, 2008

(30) Foreign Application Priority Data
Jan. 31, 2007   (TW) .............................. 96103507 A

(51) Int. Cl.
*H03H 7/18*   (2006.01)
(52) U.S. Cl. ........................................ 333/138; 333/165
(58) Field of Classification Search ................. 333/138, 333/165–167, 172
See application file for complete search history.

(56) References Cited

U.S. PATENT DOCUMENTS 3,976,958 A * 8/1976 Seidel .......................... 333/100
4,298,873 A * 11/1981 Roberts ....................... 342/375

OTHER PUBLICATIONS

Kim et al., "A New Active Phase Shifter Using a Vector Sum Method", IEEE Microwave and Guided Wave Letters, vol. 10 No. 6, Jun. 2000, p. 233-235.
Viveiros, David et al., "A Turnable All-Pass MMIC Active Phase Shifter," IEEE Transactions on Microwave Theory and Techniques, vol. 50, No. 8, Aug. 2002, p. 1885-1889.

* cited by examiner

*Primary Examiner*—Don P Le
(74) *Attorney, Agent, or Firm*—Muncy, Geissler, Olds & Lowe, PLLC

(57) ABSTRACT

A full range phase shifter circuit includes a power divider, a hybrid coupler, a differential phase shifter, a power combiner and switched attenuators. The power divider, hybrid coupler, differential phase shifter and power combiner comprise lumped elements and can be integrated in semiconductor processes, decreasing the circuit size of the full range phase shifter.

34 Claims, 6 Drawing Sheets

PHASE SHIFTER CIRCUIT

BACKGROUND OF THE INVENTION

1. Field of the Invention

The invention relates to a phase shifter, and more particularly to a full range phase shifter.

2. Description of the Related Art

With the proliferation of wireless communication, the demands on antennas have increased. A single antenna typically has only a fixed field. To fulfill practical demands, antennas are generally designed to have full range. A full range design provides convenience. An adjustable field antenna offers increased data rate and relatively better communication capability under interference and high noise. A full range antenna can be achieved by building an antenna array comprising several antennas and a phase shifter. The field of the antenna array is made changeable by utilizing the phase shifter at the backend of the antennas for adjusting the phases of input or output signals. Various phase-array antennas such as the core technique, smart antenna, multiple-input multiple-output (MIMO) system, and adaptive antenna system (AAS) are inspired to fulfill the demands of high data rate, wide coverage, and channel capacity.

The smart antenna, to be adopted by the 4th generation communication system, can process signals received from the antenna array; thus, the field of the antenna array is adjusted automatically. The beam-forming capability of the phase-array antenna offers the gain and focused coverage required by services such as WiMax.

In phase-array antenna systems and the described smart antenna, phase shifters play a key role. A phase shifter can be analog or digital depending on the phase shifting method. The analog phase shifter can be a reflective load phase shifter, a transmission line load phase shifter, or an inductor and capacitor phase shifter. The digital phase shifter can be a vector sum phase shifter and a line switch phase shifter.

BRIEF SUMMARY OF THE INVENTION

Phase shifter circuits are provided. An exemplary embodiment of a phase shifter circuit comprises a power divider, a first switched attenuator, a second switched attenuator, a hybrid coupler, a differential phase shifter, a third switched attenuator, a fourth switched attenuator, and a power combiner. The power divider is coupled to a signal input terminal for receiving an input signal and comprises a plurality of first lumped capacitors and a plurality of first lumped inductors. The power divider divides the power of the input signal to a first output terminal and a second output terminal. The first switched attenuator is coupled to the first output terminal for attenuating the signal received from the first output terminal and outputs a first attenuated signal. The second switched attenuator is coupled to the second output terminal for attenuating the signal received from the second output terminal and outputs a second attenuated signal. The hybrid coupler comprises a plurality of second lumped capacitors and a plurality of second lumped inductors. The hybrid coupler is coupled to the first switched attenuator and the second switched attenuator for distributing the power of the first attenuated signal and the second attenuated signal. The hybrid coupler outputs a first coupled signal and a second coupled signal, wherein a first phase difference exists between the first coupled signal and the second coupled signal. The differential phase shifter comprises a plurality of third lumped capacitors and a plurality of third lumped inductors, and is coupled to the hybrid coupler for receiving the first coupled signal and the second coupled signal. The differential phase shifter outputs a first phase shifted signal and a second phase shifted signal, wherein a second phase difference exists between the first coupled signal and the first phase shifted signal, a third phase difference exists between the second coupled signal and the second phase shifted signal; and a fourth phase difference exists between the second phase difference and the third phase difference. The third switched attenuator attenuates the first phase shifted signal and outputs a third attenuated signal. The fourth switched attenuator attenuates the second phase shifted signal and outputs a fourth attenuated signal. The power combiner comprises a plurality of fourth lumped capacitors and a plurality of fourth lumped inductors, and is coupled to the third switched attenuator and the fourth switched attenuator for combining the third attenuated signal and the fourth attenuated signal into an output signal and outputs the output signal from a signal output terminal, wherein a fifth phase difference exists between the output signal and the input signal.

An exemplary embodiment of a phase shifter circuit comprises a power divider, a first switched attenuator, a second switched attenuator, a hybrid coupler, a differential phase shifter, a third switched attenuator, a fourth switched attenuator, a power combiner, and an active all-pass phase shifter. The power divider is coupled to a signal input terminal for receiving an input signal and divides the power of the input signal to a first output terminal and a second output terminal. The first switched attenuator is coupled to the first output terminal for attenuating the signal received from the first output terminal and outputs a first attenuated signal. The second switched attenuator is coupled to the second output terminal for attenuating the signal received from the second output terminal and outputs a second attenuated signal. The hybrid coupler is coupled to the first switched attenuator and the second switched attenuator for distributing the power of the first attenuated signal and the second attenuated signal and outputs a first coupled signal and a second coupled signal, wherein a first phase difference exists between the first coupled signal and the second coupled signal. The differential phase shifter is coupled to the hybrid coupler for receiving the first coupled signal and the second coupled signal and outputs the. first phase shifted signal and the second phase shifted signal, wherein a second phase difference exists between the first coupled signal and the first phase shifted signal a third phase difference exists between the second coupled signal and the second phase shifted signal, and a fourth phase difference exists between the second phase difference and the third phase difference. The third switched attenuator attenuates the first phase shifted signal and outputs a third attenuated signal. The fourth switched attenuator attenuates the second phase shifted signal and outputs a fourth attenuated signal. The power combiner is coupled to the third switched attenuator and the fourth switched attenuator for combining the third attenuated signal and the fourth attenuated signal into a combined signal and outputs the combined signal from a third output terminal, wherein a fifth phase difference exists between the combined signal and the input signal. The active all-pass phase shifter is coupled between the power combiner and a fourth output terminal. The active all-pass phase shifter adjusts a phase of the output signal using a variable capacitor and amplifies the power of the output signal A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
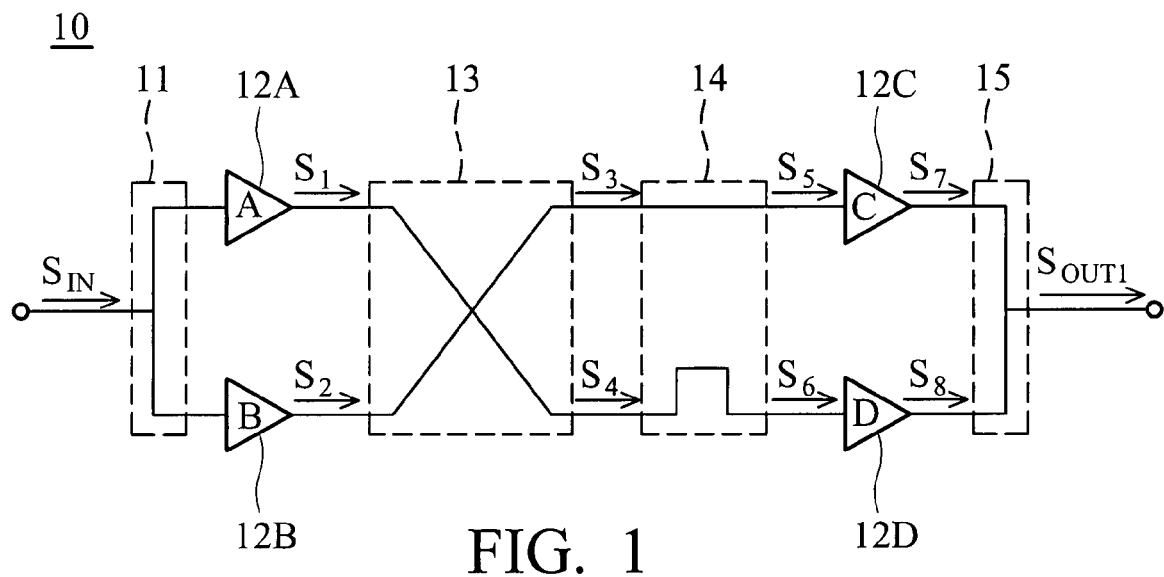
FIG. 1 illustrates a block diagram of a phase shifter circuit according to an embodiment of the invention.

FIG. 1 illustrates a block diagram of a phase shifter circuit 10 according to an embodiment of the invention. A phase shifter circuit 10 comprises a power divider 11 connected to a signal input terminal for receiving an input signal $S_{IN}$ and divides the power of the input signal $S_{IN}$ into two switched attenuators 12A and 12B. The switched attenuator 12A with a gain A attenuates the signal received from the power divider 11 and outputs an attenuated signal $S_1$ to a hybrid coupler 13. The switched attenuator 12B with a gain B attenuates the signal received from the power divider 11 and outputs an attenuated signal $S_2$ to the hybrid coupler 13. The hybrid coupler 13 connected to the switched attenuators 12A and 12B distributes the power of the attenuated signals $S_1$ and $S_2$ and outputs two coupled signals $S_3$ and $S_4$, wherein a first phase difference exists between the coupled signals $S_3$ and $S_4$. A differential phase shifter 14 connected to the hybrid coupler 13 receives the coupled signals $S_3$ and $S_4$ and outputs two phase shifted signals $S_5$ and $S_6$, wherein a second phase difference exists between the coupled signal $S_3$ and the phase shifted signal $S_5$, a third phase difference between the coupled signal $S_4$ and the phase shifted signal $S_6$, and a fourth phase difference exists between the second phase difference and the third phase difference. The differential phase shifter 14 is further connected to two switched attenuators 12C and 12D. The switched attenuator 12C with a gain C attenuates the signal received from the differential phase shifter 14 and outputs an attenuated signal $S_7$ to a power combiner 15. The switched attenuator 12D with a gain D attenuates the signal received from the differential phase shifter 14 and outputs an attenuated signal $S_8$ to the power combiner 15. The power combiner 15 combines the attenuated signals $S_7$ and $S_8$ into a combined signal $S_{OUT1}$ and outputs the combined signal $S_{OUT1}$ from an output terminal. The transfer function T of the phase shifter circuit 10 illustrated in FIG. 1 can be derived as $$T=(BC-AD)/2\sqrt{2}+j(AC-BD)/2\sqrt{2}=|T|e^{j\angle T} \quad (1.1)$$

wherein the gains A, B, C and D of the switched attenuators 12A, 12B, 12C and 12D respectively is switched between H and L two states. The H and L states are in the same phase and the H state is 7.66 dB higher than the L state in magnitude. The eight phase shift states that can be achieved by the phase shifter circuit 10 by controlling the states of gains A, B, C, D and incorporating them with the first, second, and third phase difference made by the hybrid coupler 13 and the differential phase shifter 14 respectively are shown in Table 1:

TABLE 1

| | Phase shift states with required control states | | | | | | | |
|---|---|---|---|---|---|---|---|---|
| | 0° | 45° | 90° | 135° | 180° | 225° | 270° | 315° |
| A | L | H | H | H | H | H | L | L |
| B | H | H | L | L | L | H | H | H |
| C | H | H | H | H | L | L | L | H |
| D | L | L | L | H | H | H | H | H |

Figure 2:
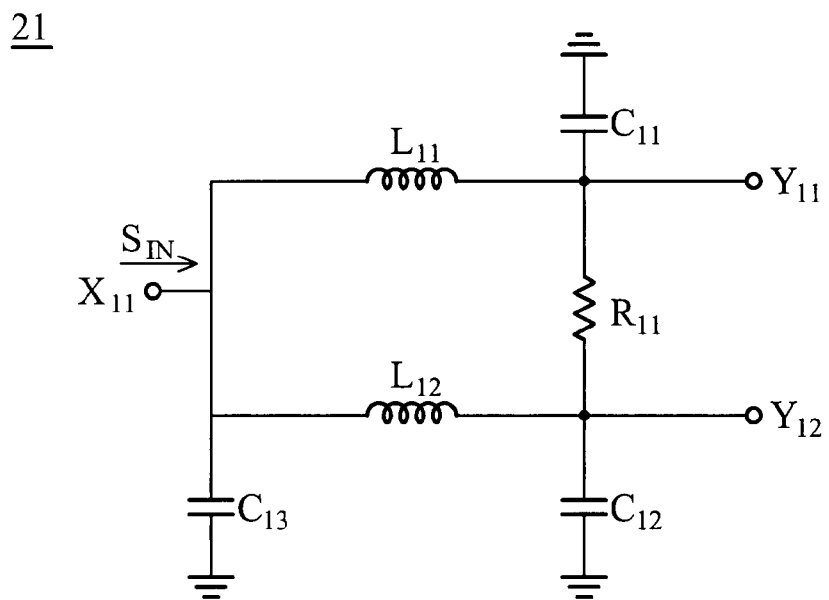
FIG. 2 illustrates a power divider according to an embodiment of the invention.

The following FIGS. 2-7 illustrate an exemplary circuit of each stage of the phase shifter circuit 10. FIG. 2 illustrates a power divider 21 comprised of a plurality of lumped capacitors and a plurality of lumped inductors according to an embodiment of the invention. The power divider 21 divides the power of input signal $S_{IN}$ received from an input terminal $X_{11}$ and outputs the divided signal into two output terminals $Y_{11}$ and $Y_{12}$. In this embodiment, the power divider 21 is a Wilkinson power divider. The power divider 21 comprises an inductor $L_{11}$ connected between the input terminal $X_{11}$ and the output terminal $Y_{11}$, an inductor $L_{12}$ connected between the input terminal $X_{11}$ and the output terminal $Y_{12}$, a capacitor $C_{11}$ connected between the output terminal $Y_{11}$ and a ground node, a capacitor $C_{12}$ connected between the output terminal $Y_{12}$ and the ground node, a capacitor $C_{13}$ connected between the input terminal $X_{11}$ and the ground node, and a resistor $R_{11}$ connected between the output terminals $Y_{11}$ and $Y_{12}$. The power divider 21 comprises a plurality of lumped capacitors and a plurality of lumped inductors and can reduce the size of the power divider circuit.

Figure 3:
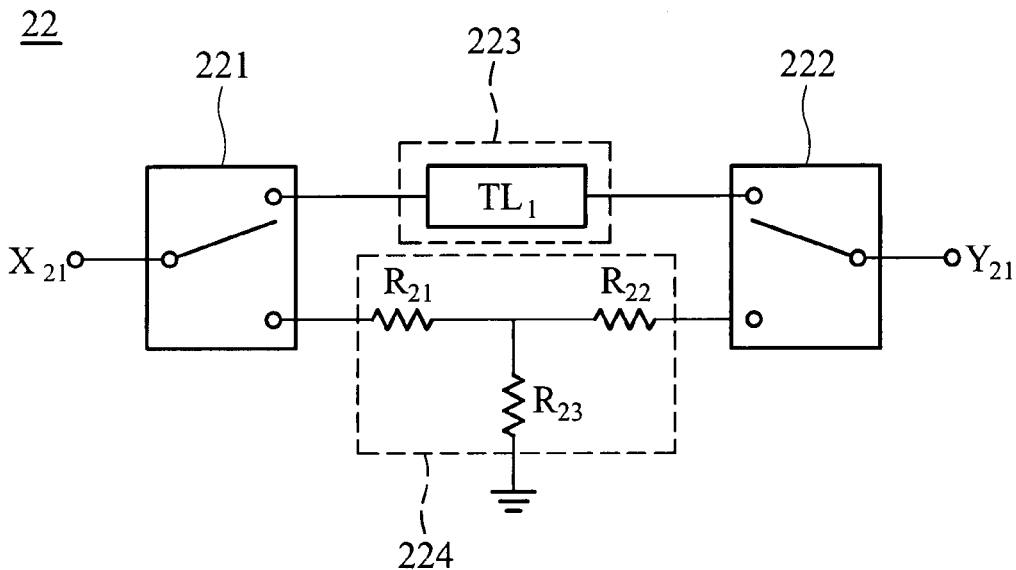
FIG. 3 illustrates a switched attenuator according to an embodiment of the invention.

FIG. 3 illustrates a switched attenuator 22 according to an embodiment of the invention. The switched attenuator 22 attenuates the signal received from an input terminal $X_{21}$. The switched attenuator 22 comprises an attenuated circuit 223, an attenuated circuit 224, a switch 221 for selectively connecting the attenuated circuit 223 or attenuated circuit 224 to the input terminal $X_{21}$, and a switch 222 for selectively connecting the attenuated circuit 223 and attenuated circuit 224 to an output terminal $Y_{21}$. The attenuated circuit 223 can be a transmission line $TL_1$ and the attenuated circuit 224 comprises resistor $R_{21}$ connected to the switch 221, a resistor $R_{22}$ connected between the resistor $R_{21}$ and the switch 222, and a resistor $R_{23}$ connected between the ground node and a connection point of the resistors $R_{21}$ and $R_{22}$. In this embodiment, switches 221 and 222 are switched to connect to attenuated circuits 223 or 224 simultaneously, and the resistance of resistors $R_{21}$ and $R_{22}$ is about 20.7Ω, and the resistance of resistor $R_{23}$ is about 52.5Ω. By simultaneously switching the switches 221 and 222, the gain of the switched attenuator 22 is controlled between two states, H and L, wherein H and L states are in the same phase and the H state is 7.66 dB higher than the L state in magnitude.

Figure 4:
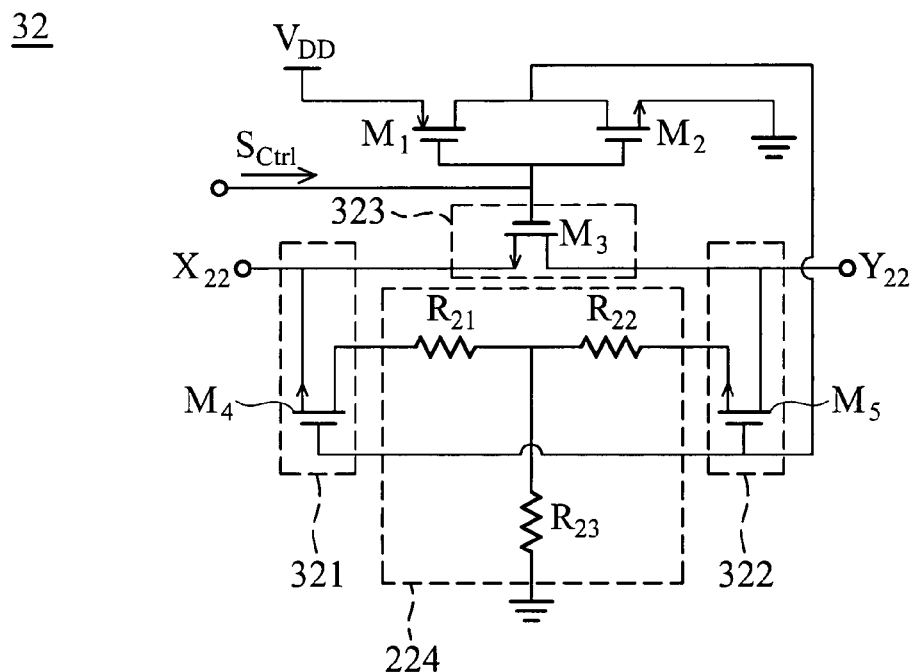
FIG. 4 illustrates a switched attenuator according to another embodiment of the invention.

FIG. 4 illustrates a switched attenuator 32 according to another embodiment of the invention. In the switched attenuator 32, the switches 321 and 322 comprise transistors $M_4$ and $M_5$ respectively, and the attenuated circuit 323 comprises transistor $M_3$. The switched attenuator 32 controls the switches 321 and 322 to connect to one of the attenuated circuits 323 and 224 simultaneously through a control signal $S_{Ctrl}$ and attenuates the signal received from input terminal $X_{22}$. The switched attenuator 32 further comprises transistors $M_1$ and $M_2$, wherein a source of the transistor $M_1$ connects to the power supply $V_{DD}$, a drain of the transistor $M_1$ connects to a drain of the transistor $M_2$, and a source of the transistor $M_2$ connects to the ground node. Thus the transistors $M_1$ and $M_2$ forms an inverter for inverting the control signal $S_{Ctrl}$ and passing it to the switches 321 and 322. By simultaneously switching the switches 321 and 322, the gain of the switched attenuator 32 is controlled between two states, H and L, wherein H and L states are in the same phase and the H state is 7.66 dB higher than the L state in magnitude.

Figure 5:
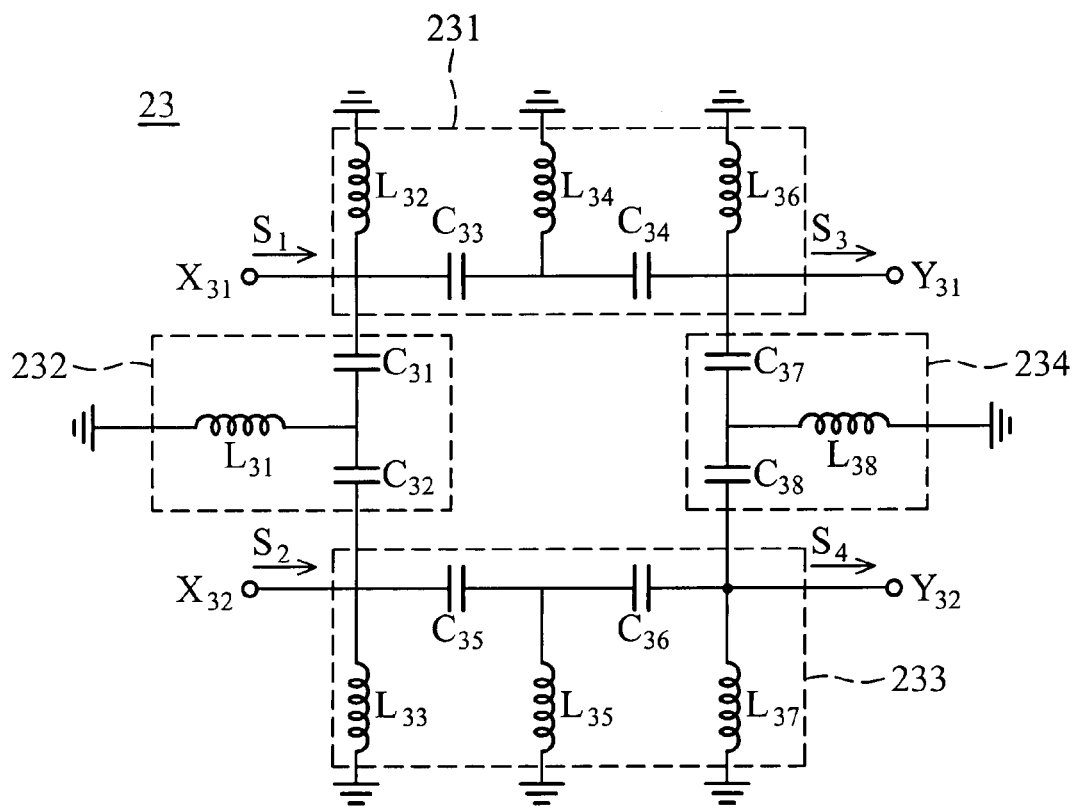
FIG. 5 illustrates a hybrid coupler according to an embodiment of the invention.

FIG. 5 illustrates a hybrid coupler 23 according to an embodiment of the invention. The hybrid coupler 23 includes four high pass filters 231, 232, 233, and 234 comprised of a plurality of lumped capacitors and a plurality of lumped inductors. The hybrid coupler 23 distributes the power of the attenuated signals $S_1$ and $S_2$ received from two input terminals $X_{31}$, and $X_{32}$ respectively and outputs two coupled signals $S_3$ and $S_4$, wherein a first phase difference exists between the coupled signals $S_3$ and $S_4$. The hybrid coupler 23 comprises a capacitor $C_{31}$ connected to the input terminal $X_{31}$, a capacitor $C_{32}$ connected between the capacitor $C_{31}$ and the input terminal $X_{32}$, an inductor $L_{31}$ connected between a ground node and a connection point of the capacitors $C_{31}$, and $C_{32}$, an inductor $L_{32}$ connected between the capacitor $C_{31}$, and the ground node, an inductor $L_{33}$ connected between the capacitor $C_{32}$ and the ground node, a capacitor $C_{33}$ connected to the inductor $L_{32}$, a capacitor $C_{34}$ connected between the output terminal $Y_{31}$, and the sixth capacitor $C_{33}$, an inductor $L_{34}$ connected between the ground node and a connection point of the capacitors $C_{33}$ and $C_{34}$, a capacitor $C_{35}$ connected to the inductor $L_{33}$, a capacitor $C_{36}$ connected between the output terminal $Y_{32}$ and the capacitor $C_{35}$, an inductor $L_{35}$ connected between the ground node and a connection point of capacitors $C_{35}$ and $C_{36}$, an inductor $L_{36}$ connected between the capacitor $C_{34}$ and the ground node, an inductor $L_{37}$ connected between the capacitor $C_{36}$ and the ground node, a capacitor $C_{37}$ connected to the inductor $L_{36}$, a capacitor $C_{38}$ connected between the inductor $L_{37}$ and the capacitor $C_{37}$, and an inductor $L_{38}$ connected between the ground node and a connection point of the capacitors $C_{37}$ and $C_{38}$. According to the embodiment of the invention, the hybrid coupler 23 comprised of a plurality of lumped capacitors and a plurality of lumped inductors can reduce the size of the hybrid coupler circuit. The capacitance $C_{V1}$ of the capacitors $C_{31}$, $C_{32}$, $C_{37}$ and $C_{38}$ can be derived as $$C_{V1} = \frac{\sqrt{2}}{w_0 Z_0}, \qquad (1.2)$$

the capacitance $C_{V2}$ of the capacitors $C_{33}$, $C_{34}$, $C_{35}$ and $C_{36}$ can be derived as $$C_{V2} = \frac{2}{w_0 Z_0}, \qquad (1.3)$$

the inductance $L_{V1}$ of the inductors $L_{31}$ and $L_{38}$ can be derived as $$L_{V1} = \frac{(\sqrt{2}+1)Z_0}{2w_0}, \qquad (1.4)$$

the inductance $L_{V2}$ of the inductors $L_{34}$ and $L_{35}$ can be derived as $$L_{V2} = \frac{(\sqrt{2}+1)Z_0}{2\sqrt{2}\,w_0}, \qquad (1.5)$$

and the inductance $L_{V3}$ of the inductors $L_{32}$, $L_{33}$, $L_{36}$ and $L_{37}$ can be derived as $$L_{V3} = \frac{Z_0}{w_0}, \qquad (1.6)$$

wherein $w_0$ is the center frequency of the phase shifter circuit 10 and $Z_0$ is the impedance of the transmission line.

Figure 6:
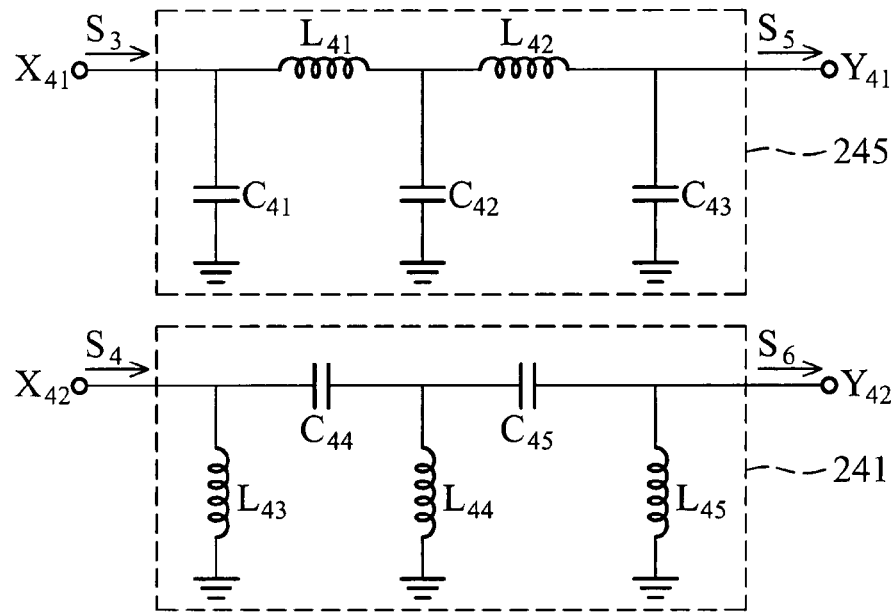
FIG. 6 illustrates a differential phase shifter according to an embodiment of the invention.

FIG. 6 illustrates a differential phase shifter 24 according to an embodiment of the invention. The differential phase shifter 24 includes a high pass filter 241 and a low pass filter 245, comprised of a plurality of lumped capacitors and a plurality of lumped inductors. The differential phase shifter 24 receives the coupled signals $S_3$ and $S_4$ from two input terminals $X_{41}$ and $X_{42}$ respectively and outputs two phase shifted signals $S_5$ and $S_6$, wherein a second phase difference exists between the coupled signal $S_3$ and the phase shifted signal $S_5$, a third phase difference exists between the coupled signal $S_4$ and the phase shifted signal $S_6$, and a fourth phase difference exists between the second phase difference and the third phase difference. The differential phase shifter 24 comprises an inductor $L_{41}$ connected to the input terminal $X_{41}$, a capacitor $C_{41}$ connected between the inductor $L_4$, and a ground node, an inductor $L_{42}$ connected between the inductor $L_{41}$, and the output terminal $Y_{41}$, a capacitor $C_{42}$ connected between the ground node and a connection point of the inductors $L_{41}$ and $L_{42}$, a capacitor $C_{43}$ connected between the ground node and the inductor $L_{42}$, a capacitor $C_{44}$ connected to the input terminal $X_{42}$, an inductor $L_{43}$ connected between the capacitor $C_{44}$ and the ground node, a capacitor $C_{45}$ connected between the capacitor $C_{44}$ and the output terminal $Y_{42}$, an inductor $L_{44}$ connected between the ground node and a connection point of the capacitors $C_{44}$ and $C_{45}$, and an inductor $L_{45}$ connected between the capacitor $C_{45}$ and the ground node. In this embodiment, the differential phase shifter 24, comprised of a plurality of lumped capacitors and a plurality of lumped inductors, can reduce the size of the differential phase shifter circuit. The capacitance $C_{V3}$ of the capacitors $C_{41}$ and $C_{43}$ can be derived as $$C_{V3} = \frac{1}{(\sqrt{2}+1)w_0 Z_0}, \quad (1.7)$$

the capacitance $C_{V4}$ of the capacitor $C_{42}$ can be derived as $$C_{V4} = \frac{2}{(\sqrt{2}+1)w_0 Z_0}, \quad (1.8)$$

the capacitance $C_{V5}$ of the capacitors $C_{44}$ and $C_{45}$ can be derived as $$C_{V6} = \frac{\sqrt{2}}{w_0 Z_0}, \quad (1.9)$$

the inductance $L_{V4}$ of the inductors $L_{41}$ and $L_{42}$ can be derived as $$L_{V4} = \frac{Z_0}{\sqrt{2}\,w_0}, \quad (1.10)$$

the inductance $L_{V5}$ of the inductors $L_{43}$ and $L_{45}$ can be derived as $$L_{V5} = \frac{(\sqrt{2}+1)Z_0}{2w_0}, \quad (1.11)$$

and the inductance $L_{V6}$ of the inductors $L_{44}$ can be derived as $$L_{V6} = \frac{(\sqrt{2}+1)Z_0}{2w_0} \quad (1.12)$$

Figure 7:
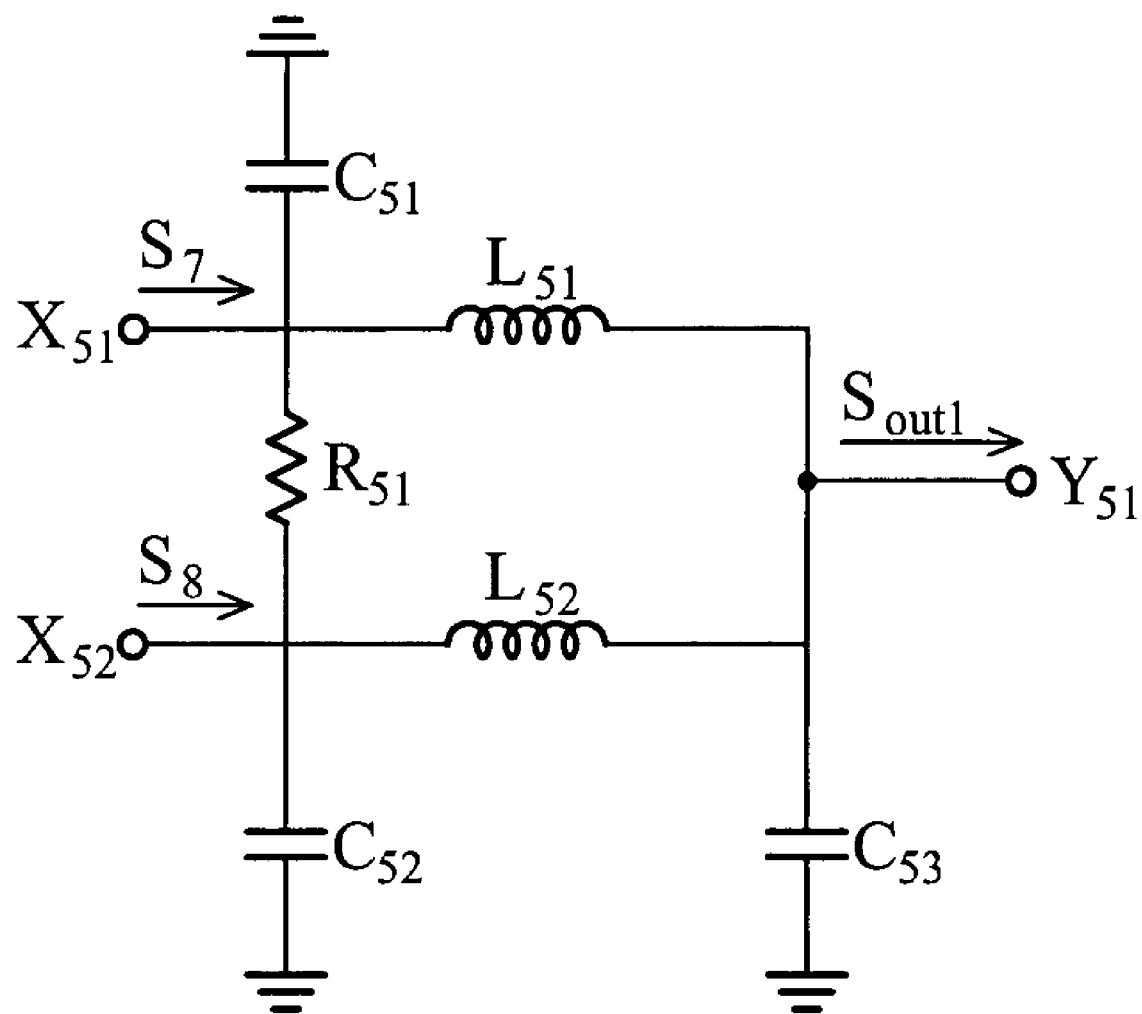
FIG. 7 illustrates a power combiner according to an embodiment of the invention.

FIG. 7 illustrates a power combiner 25 according to an embodiment of the invention. The power combiner 25 comprised of a plurality of lumped capacitors and a plurality of lumped inductors is a Wilkinson power divider. The power combiner 25 combines the two attenuated signals $S_7$ and $S_8$ respectively received from two input terminals $X_{51}$ and $X_{52}$ into a combined signal $S_{OUT1}$ and outputs the combined signal $S_{OUT1}$ from an output terminal $Y_{51}$. The power combiner 25 comprises a resistor $R_{51}$ connected between the input terminals $X_{51}$ and $X_{52}$, a capacitor $C_{51}$ connected between the resistor $R_{51}$ and a ground node, a capacitor $C_{52}$ connected between the resistor $R_{51}$ and the ground node, an inductor $L_{51}$ connected between the capacitor $C_{51}$ and an output terminal $Y_{51}$, an inductor $L_{52}$ connected between the capacitor $C_{52}$ and the output terminal $Y_{51}$, and a capacitor $C_{53}$ connected between the output terminal $Y_{51}$ and the ground node. According to the embodiment of the invention, the power combiner 25 comprised of a plurality of lumped capacitors and a plurality of lumped inductors can reduce the size of the power combiner circuit.

According to another embodiment of the invention, a 180 degrees hybrid coupler can replace the hybrid coupler 13 in the phase shifter circuit 10, and a 90 degrees differential phase shifter can replace the differential phase shifter 14 in the phase shifter circuit 10. By incorporating the 180 degrees hybrid coupler and the 90 degrees differential phase shifter with the gains A, B, C, and D of the four attenuators 12A, 12B, 12C and 12D, the same eight phase shift states described in Table 1 can be achieved.

Figure 8:
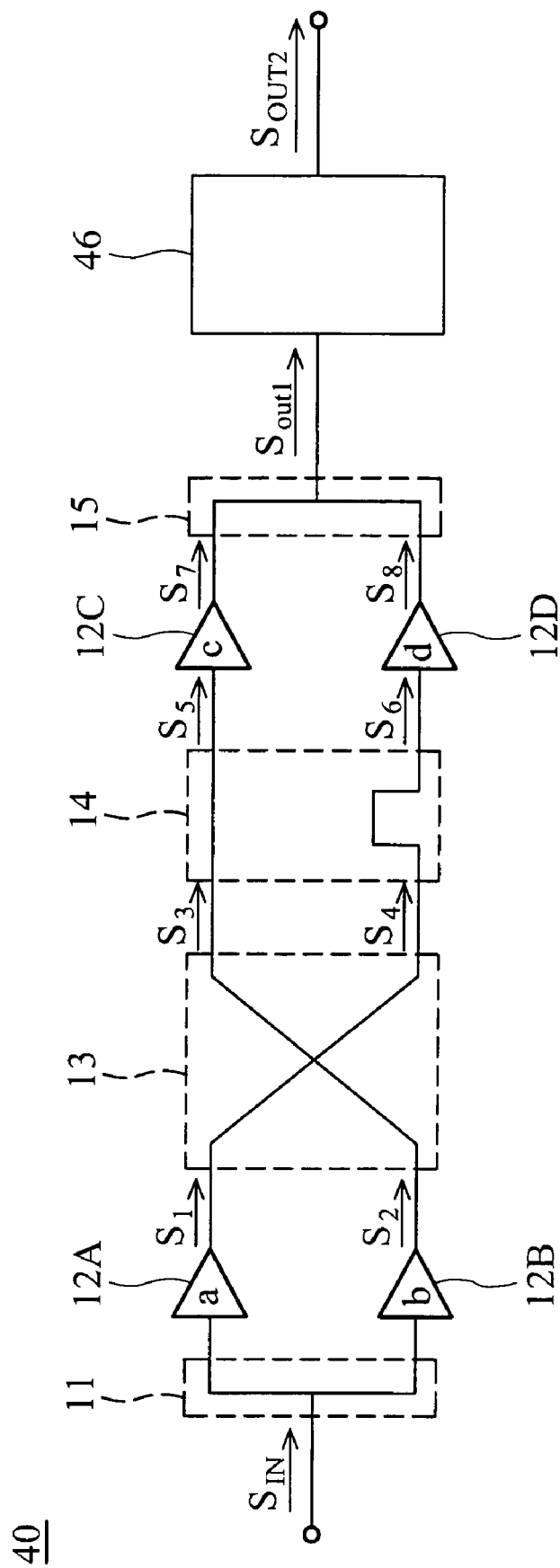
FIG. 8 illustrates a phase shifter circuit according to another embodiment of the invention.

FIG. 8 illustrates a phase shifter circuit 40 according to another embodiment of the invention. The phase shifter circuit 40 further connects an active all-pass phase shifter 46 to the output terminal of the phase shifter circuit 10 for finely adjusting the phase of the output signal $S_{OUT1}$, amplifying the power of the output signal $S_{OUT1}$, and outputting an output signal $S_{OUT2}$, wherein a fifth phase difference exists between the output signals $S_{OUT1}$ and $S_{OUT2}$.

Figure 9:
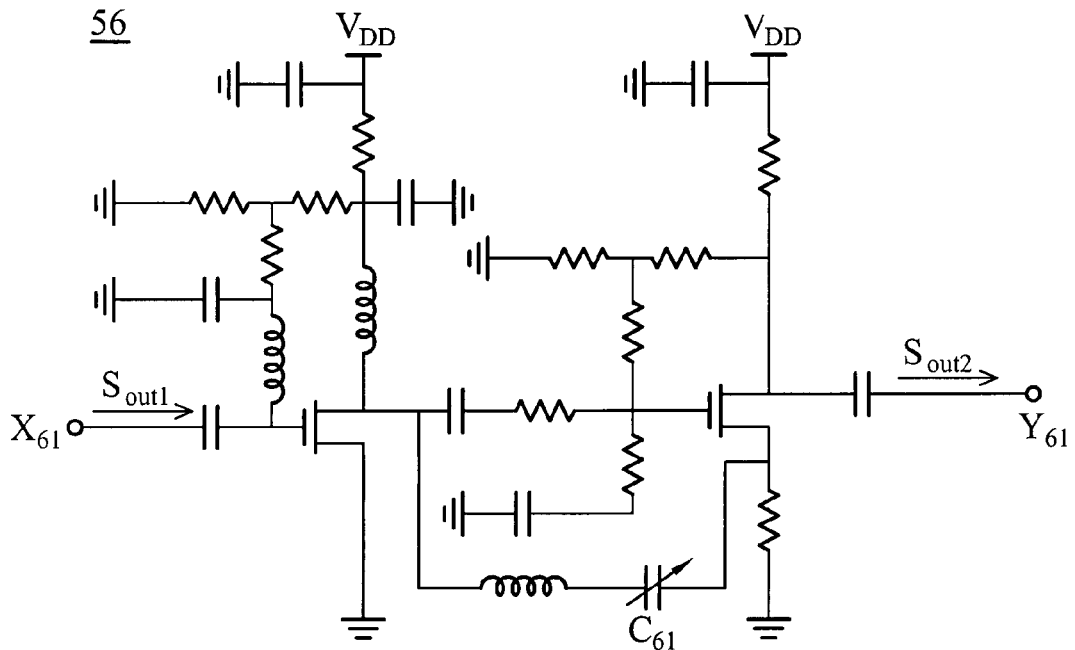
FIG. 9 illustrates an active all-pass phase shifter according to an embodiment of the invention.

FIG. 9 illustrates an active all-pass phase shifter 56 according to an embodiment of the invention. The active all-pass phase shifter 56 uses a variable capacitor $C_{61}$ to finely adjust the phase of the output signal $S_{OUT1}$ received from the input terminal $X_{61}$ and amplifies the power of the output signal $S_{OUT1}$. In the invention, the active all-pass phase shifter 56 comprised of a plurality of a lumped capacitors and a plurality of lumped inductors can reduce the size of the active all-pass phase shifter circuit and can receive a signal with a frequency around 3.5 GHz.

Figure 10:
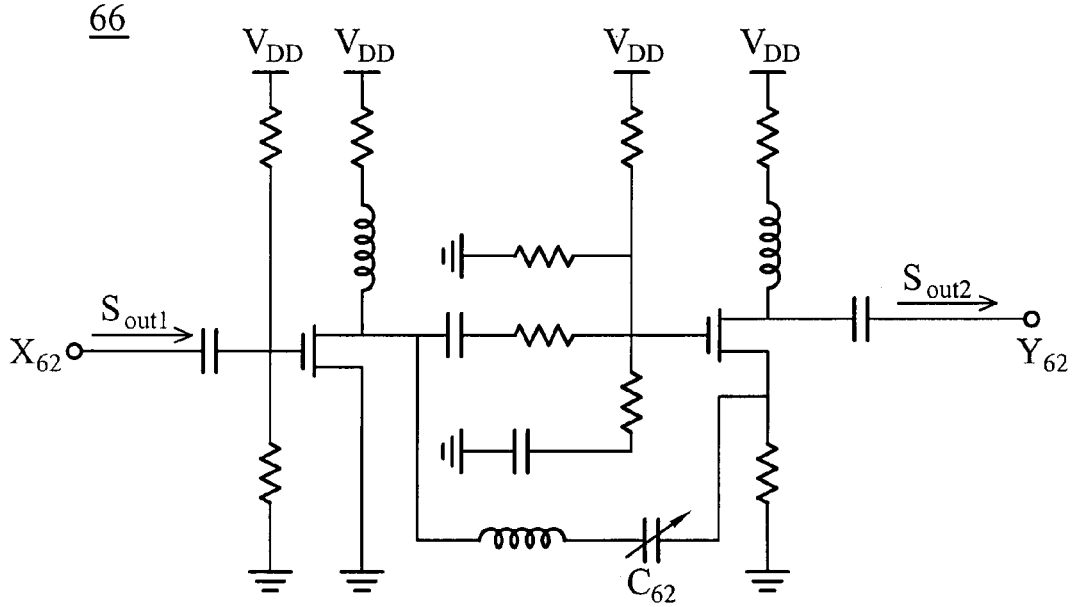
FIG. 10 is an active all-pass phase shifter according to another embodiment of the invention.

FIG. 10 illustrates an active all-pass phase shifter 66 according to another embodiment of the invention. The active all-pass phase shifter 66 uses a variable capacitor $C_{62}$ to finely adjust the phase of the output signal $S_{OUT1}$ received from the input terminal $X_{62}$ and amplifies the power of the output signal $S_{OUT1}$. Similarly, according to the embodiment of the invention, the active all-pass phase shifter 66 comprised of a plurality of lumped capacitors and a plurality of lumped inductors can reduce the size of the active all-pass phase shifter circuit and can receive the signal with a frequency of around 2.45 GHz.

The active all-pass phase shifter 46 as shown in FIG. 8 can also be an analog phase shifter capable of adjusting the phase of the output signal $S_{OUT1}$ where a range of the adjusted phase exceeds 45 degrees. The described analog phase shifter can be a reflective load phase shifter, a transmission line load phase shifter, an inductor and capacitor phase shifter, or the like. In the invention, because most elements of the phase shifter circuit are comprised of a plurality of lumped capacitors and a plurality of lumped inductors, the phase shifter circuit can be integrated into a semiconductor process and reduce the size of the circuit.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the invention shall be defined and protected by the following claims and their equivalents.

What is claimed is:

1. A phase shifter circuit, comprising:
   a power divider comprising a plurality of first lumped capacitors and a plurality of first lumped inductors, and coupled to a signal input terminal for receiving an input signal and dividing the power of the input signal to a first output terminal and a second output terminal;
   a first switched attenuator coupled to the first output terminal for attenuating the signal received from the first output terminal and outputting a first attenuated signal;

a second switched attenuator coupled to the second output terminal for attenuating the signal received from the second output terminal and outputting a second attenuated signal;

a hybrid coupler comprising a plurality of second lumped capacitors and a plurality of second lumped inductors, and coupled to the first switched attenuator and the second switched attenuator for distributing the power of the first attenuated signal and the second attenuated signal and outputting a first coupled signal and a second coupled signal, wherein there is a first phase difference between the first coupled signal and the second coupled signal;

a differential phase shifter comprising a plurality of third lumped capacitors and a plurality of third lumped inductors, and coupled to the hybrid coupler for receiving the first coupled signal and the second coupled signal and outputting a first phase shifted signal and a second phase shifted signal, wherein there are a second phase difference between the first coupled signal and the first phase shifted signal, a third phase difference between the second coupled signal and the second phase shifted signal, and a fourth phase difference between the second phase difference and the third phase difference;

a third switched attenuator attenuating the first phase shifted signal and outputting a third attenuated signal;

a fourth switched attenuator attenuating the second phase shifted signal and outputting a fourth attenuated signal; and a power combiner comprising a plurality of fourth lumped capacitors and a plurality of fourth lumped inductors, and coupled to the third switched attenuator and the fourth switched attenuator for combining the third attenuated signal and the fourth attenuated signal into an output signal and outputting the output signal from an signal output terminal, wherein there is a fifth phase difference between the output signal and the input signal.

2. The phase shifter circuit as claimed in claim 1, wherein the power divider comprises:
a first inductor coupled between the signal input terminal and the first output terminal;
a second inductor coupled between the signal input terminal and the second output terminal;
a first capacitor coupled between the first output terminal and a ground node;
a second capacitor coupled between the second output terminal and the ground node;
a third capacitor coupled between the signal input terminal and the ground node; and
a first resistor coupled between the first output terminal and the second output terminal.

3. The phase shifter circuit as claimed in claim 1, wherein the first switched attenuator and the second switched attenuator respectively comprises:
a first attenuated circuit;
a second attenuated circuit;
a first switch selectively connecting one of the first attenuated circuit and the second attenuated circuit to the power combiner; and
a second switch selectively connecting one of the first attenuated circuit and the second attenuated circuit to the hybrid coupler.

4. The phase shifter circuit as claimed in claim 3, wherein the second attenuated circuit comprises:

a second resistor coupled to the first switch;
a third resistor coupled between the second resistor and the second switch; and
a fourth resistor coupled between a ground node and a first connection point of the second resistor and the third resistor.

5. The phase shifter circuit as claimed in claim 3, wherein the third switched attenuator and the fourth switched attenuator respectively comprises:
a third attenuated circuit;
a fourth attenuated circuit;
a third switch selectively connecting one of the third attenuated circuit and the fourth attenuated circuit to the differential phase shifter; and
a fourth switch selectively connecting one of the third attenuated circuit and the fourth attenuated circuit to the power combiner.

6. The phase shifter circuit as claimed in claim 5, wherein the fourth attenuated circuit comprises:
a fifth resistor coupled to the third switch;
a sixth resistor coupled between the fifth resistor and the third switch; and
a seventh resistor coupled between a ground node and a second connection point of the fifth resistor and the sixth resistor.

7. The phase shifter circuit as claimed in claim 5, wherein the first attenuated circuit, the third attenuated circuit, the first switch, the second switch, the third switch and the fourth switch each are selected from the group consisting of a metal-oxide-semiconductor transistor, a bi-polar junction transistor, a pseudomorphic high electron mobility transistor and a heterojunction bipolar transistor, and wherein the second attenuated circuit and the fourth attenuated circuit each are selected from the group consisting of a π-resistor network and a T-resistor network.

8. The phase shifter circuit as claimed in claim 1, wherein the hybrid coupler comprises:
a fourth capacitor coupled to the first switched attenuator;
a fifth capacitor coupled between the second switched attenuator and the fourth capacitor;
a third inductor coupled between a ground node and a third connection point of the fourth capacitor and the fifth capacitor;
a fourth inductor coupled between the fourth capacitor and the ground node;
a fifth inductor coupled between the fifth capacitor and the ground node;
a sixth capacitor coupled to the fourth inductor;
a seventh capacitor coupled between the differential phase shifter and the sixth capacitor;
a sixth inductor coupled between the ground node and a fourth connection point of the sixth capacitor and the seventh capacitor;
an eighth capacitor coupled to the fifth inductor;
a ninth capacitor coupled between the differential phase shifter and the eighth capacitor;
a seventh inductor coupled between the ground node and a fifth connection point of the eighth capacitor and the ninth capacitor;
an eighth inductor coupled between the seventh capacitor and the ground node;
a ninth inductor coupled between the ninth capacitor and the ground node;
a tenth capacitor coupled to the eight inductor;
an eleventh capacitor coupled between the ninth inductor and the tenth capacitor; and a tenth inductor coupled between the ground node and a sixth connection point of the tenth capacitor and the eleventh capacitor.

9. The phase shifter circuit as claimed in claim 1, wherein the differential phase shifter comprises:
    an eleventh inductor coupled to the hybrid coupler;
    a twelfth capacitor coupled between the eleventh inductor and a ground node;
    a twelfth inductor coupled between the eleventh inductor and the third switched attenuator;
    a thirteenth capacitor coupled between the ground node and a seventh connection point of the eleventh inductor and the twelfth inductor;
    a fourteenth capacitor coupled between the ground node and the twelfth inductor;
    a fifteenth capacitor coupled to the hybrid coupler;
    a thirteenth inductor coupled between the fifteenth capacitor and the ground node;
    a sixteenth capacitor coupled between the fifteenth capacitor and the fourth switched attenuator;
    a fourteenth inductor coupled between the ground node and an eighth connection point of the fifteenth capacitor and the sixteenth capacitor; and
    a fifteenth inductor coupled between the sixteenth capacitor and the ground node.

10. The phase shifter circuit as claimed in claim 1, wherein the power combiner comprising:
    an eighth resistor coupled between the third switched attenuator and the fourth switched attenuator;
    a seventeenth capacitor coupled between the eighth resistor and a ground node;
    an eighteenth capacitor coupled between the eighth resistor and the ground node;
    a sixteenth inductor coupled between the seventeenth capacitor and the signal output terminal;
    a seventeenth inductor coupled between the eighteenth capacitor and the signal output terminal; and
    a nineteenth capacitor coupled between the signal output terminal and the ground node.

11. The phase shifter circuit as claimed in claim 1, further comprising an active all-pass phase shifter coupled to the signal output terminal to adjust a phase of the output signal using a variable capacitor and amplifying the power of the output signal.

12. The phase shifter circuit as claimed in claim 11, wherein the phase shifter circuit is integrated into a semiconductor process.

13. The phase shifter circuit as claimed in claim 1, further comprising an analog phase shifter coupled to the signal output terminal to adjust a phase of the output signal, wherein a range of the adjusted phase of the output signal by the analog phase shifter exceeds 45 degrees.

14. The phase shifter circuit as claimed in claim 13, wherein the analog phase shifter is selected from the group consisting of a reflective load phase shifter, a transmission line load phase shifter and an inductor and capacitor phase shifter.

15. The phase shifter circuit as claimed in claim 1, wherein the power divider and the power combiner are Wilkinson power dividers.

16. The phase shifter circuit as claimed in claim 1, wherein the gains of the first switched attenuator, the second switched attenuator, the third switched attenuator and the fourth switched attenuator are switched between a high state and a low state.

17. The phase shifter circuit as claimed in claim 1, wherein the hybrid coupler is 90 degrees hybrid coupler and the fourth phase difference is 180 degrees.

18. The phase shifter circuit as claimed in claim 1, wherein the hybrid coupler is 180 degrees hybrid coupler and the fourth phase difference is 90 degrees.

19. A phase shifter circuit comprising:
    a power divider coupled to an signal input terminal for receiving an input signal and dividing the power of the input signal to a first output terminal and a second output terminal;
    a first switched attenuator coupled to the first output terminal for attenuating the signal received from the first output terminal and outputting a first attenuated signal;
    a second switched attenuator coupled to the second output terminal for attenuating the signal received from the second output terminal and outputting a second attenuated signal;
    a hybrid coupler coupled to the first switched attenuator and the second switched attenuator for distributing the power of the first attenuated signal and the second attenuated signal and outputting a first coupled signal and a second coupled signal, wherein there is a first phase difference between the first coupled signal and the second coupled signal;
    a differential phase shifter coupled to the hybrid coupler for receiving the first coupled signal and the second coupled signal and outputting the first phase shifted signal and the second phase shifted signal, wherein there are a second phase difference between the first coupled signal and the first phase shifted signal, a third phase difference between the second coupled signal and the second phase shifted signal, and a fourth phase difference between the second phase difference and the third phase difference;
    a third switched attenuator attenuating the first phase shifted signal and outputting a third attenuated signal;
    a fourth switched attenuator attenuating the second phase shifted signal and outputting a fourth attenuated signal; and
    a power combiner coupled to the third switched attenuator and the fourth switched attenuator for combining the third attenuated signal and the fourth attenuated signal into a combined signal and outputting the combined signal from a third output terminal, wherein there is a fifth phase difference between the combined signal and the input signal;
    an active all-pass phase shifter coupled between the power combiner and a fourth output terminal, wherein the active all-pass phase shifter adjusts a phase of the output signal using a variable capacitor and amplifies the power of the output signal.

20. The phase shifter circuit as claimed in claim 19, wherein the power divider comprises:
    a first inductor coupled between the signal input terminal and the first output terminal;
    a second inductor coupled between the signal input terminal and the second output terminal;
    a first capacitor coupled between the first output terminal and a ground node;
    a second capacitor coupled between the second output terminal and the ground node;
    a third capacitor coupled between the signal input terminal and the ground node; and
    a first resistor coupled between the first output terminal and the second output terminal.

21. The phase shifter circuit as claimed in claim 19, wherein the first switched attenuator and the second switched attenuator respectively comprises:
 a first attenuated circuit;
 a second attenuated circuit;
 a first switch selectively connecting one of the first attenuated circuit and the second attenuated circuit to the power combiner; and
 a second switch selectively connecting one of the first attenuated circuit and the second attenuated circuit to the hybrid coupler.

22. The phase shifter circuit as claimed in claim 21, wherein the second attenuated circuit comprises:
 a second resistor coupled to the first switch;
 a third resistor coupled between the second resistor and the second switch; and
 a fourth resistor coupled between a ground node and a first connection point of the second resistor and the third resistor.

23. The phase shifter circuit as claimed in claim 21, wherein the third switched attenuator and the fourth switched attenuator respectively comprises:
 a third attenuated circuit;
 a fourth attenuated circuit;
 a third switch selectively connecting one of the third attenuated circuit and the fourth attenuated circuit to the differential phase shifter; and
 a fourth switch selectively connecting one of the third attenuated circuit and the fourth attenuated circuit to the power combiner.

24. The phase shifter circuit as claimed in claim 23, wherein the fourth attenuated circuit comprises:
 a fifth resistor coupled to the third switch;
 a sixth resistor coupled between the fifth resistor and the third switch; and
 a seventh resistor coupled between a ground node and a second connection point of the fifth resistor and the sixth resistor.

25. The phase shifter circuit as claimed in claim 23, wherein the first attenuated circuit, the third attenuated circuit, the first switch, the second switch, the third switch and the fourth switch each are selected from the group consisting of a metal-oxide-semiconductor transistor, a bi-polar junction transistor, a pseudomorphic high electron mobility transistor and a heterojunction bipolar transistor, and wherein the second attenuated circuit and the fourth attenuated circuit are each selected from the group consisting of a π-resistor network and a T-resistor network.

26. The phase shifter circuit as claimed in claim 19, wherein the hybrid coupler comprises:
 a fourth capacitor coupled to the first switched attenuator;
 a fifth capacitor coupled between the second switched attenuator and the fourth capacitor;
 a third inductor coupled between a ground node and a third connection point of the fourth capacitor and the fifth capacitor;
 a fourth inductor coupled between the fourth capacitor and the ground node;
 a fifth inductor coupled between the fifth capacitor and the ground node;
 a sixth capacitor coupled to the fourth inductor;
 a seventh capacitor coupled between the differential phase shifter and the sixth capacitor;
 a sixth inductor coupled between the ground node and a fourth connection point of the sixth capacitor and the seventh capacitor;
 an eighth capacitor coupled to the fifth inductor;
 a ninth capacitor coupled between the differential phase shifter and the eighth capacitor;
 a seventh inductor coupled between the ground node and a fifth connection point of the eighth capacitor and the ninth capacitor;
 an eight inductor coupled between the seventh capacitor and the ground node;
 a ninth inductor coupled between the ninth capacitor and the ground node;
 a tenth capacitor coupled to the eight inductor;
 an eleventh capacitor coupled between the ninth inductor and the tenth capacitor; and
 a tenth inductor coupled between the ground node and a sixth connection point of the tenth-capacitor and the eleventh capacitor.;

27. The phase shifter circuit as claimed in claim 19, wherein the differential phase shifter comprises:
 an eleventh inductor coupled to the hybrid coupler;
 a twelfth capacitor coupled between the eleventh inductor and a ground node;
 a twelfth inductor coupled between the eleventh inductor and the third switched attenuator;
 a thirteenth capacitor coupled between the ground node and a seventh connection point of the eleventh inductor and the twelfth inductor;
 a fourteenth capacitor coupled between the ground node and the twelfth inductor;
 a fifteenth capacitor coupled to the hybrid coupler;
 a thirteenth inductor coupled between the fifteenth capacitor and the ground node;
 a sixteenth capacitor coupled between the fifteenth capacitor and the fourth switched attenuator;
 a fourteenth inductor coupled between the ground node and an eighth connection point of the fifteenth capacitor and the sixteenth capacitor; and
 a fifteenth inductor coupled between the sixteenth capacitor and the ground node.

28. The phase shifter circuit as claimed in claim 19, wherein the power combiner comprises:
 an eighth resistor coupled between the third switched attenuator and the fourth switched attenuator;
 a seventeenth capacitor coupled between the eighth resistor and a ground node;
 an eighteenth capacitor coupled between the eighth resistor and the ground node;
 a sixteenth inductor coupled between the seventeenth capacitor and the third output terminal;
 a seventeenth inductor coupled between the eighteenth capacitor and the third output terminal; and
 a nineteenth capacitor coupled between the third output terminal and the ground node.

29. The phase shifter circuit as claimed in claim 19, wherein the phase shifter circuit is integrated into a semiconductor process.

30. The phase shifter circuit as claimed in claim 19, wherein the power divider and the power combiner are Wilkinson power dividers.

31. The phase shifter circuit as claimed in claim 19, wherein the gains of the first switched attenuator, the second switched attenuator, the third switched attenuator and the fourth switched attenuator are switched between a high state and a low state.

32. The phase shifter circuit as claimed in claim 19, wherein the hybrid coupler is 90 degrees hybrid coupler and the fourth phase difference is 180 degrees.

33. The phase shifter circuit as claimed in claim 19, wherein the hybrid coupler is 180 degrees hybrid coupler and the fourth phase difference is 90 degrees.

34. The phase shifter circuit as claimed in claim 19, wherein the power divider, the hybrid coupler, the differential phase shifter and the power combiner comprise a plurality of lumped capacitors and a plurality of lumped inductors.

* * * * *